(12) United States Patent
Chao et al.

(10) Patent No.: US 10,938,399 B1
(45) Date of Patent: Mar. 2, 2021

(54) DIGITAL CORRECTED TWO-STEP SAR ADC

(71) Applicants: Yuan-Ju Chao, Cupertino, CA (US);
Chia-Tung Lee, Hsin-Chu (TW)

(72) Inventors: Yuan-Ju Chao, Cupertino, CA (US);
Chia-Tung Lee, Hsin-Chu (TW)

(73) Assignee: IPGREAT INCORPORATED, Grand Cayman (KY)

( * ) Notice: Subject to any disclaimer, the term of this patent is extended or adjusted under 35 U.S.C. 154(b) by 0 days.

(21) Appl. No.: 16/893,946

(22) Filed: Jun. 5, 2020

(51) Int. Cl.
*H03M 1/06* (2006.01)

(52) U.S. Cl.
CPC ................... *H03M 1/0604* (2013.01)

(58) Field of Classification Search
CPC ........ H03M 1/0604; H03M 1/00; H03M 1/06; H03M 1/1023
USPC .......................................... 341/161, 118, 155
See application file for complete search history.

(56) References Cited

U.S. PATENT DOCUMENTS

| | | | | |
|---|---|---|---|---|
| 5,245,343 A * | 9/1993 | Greenwood | ............ | H03M 3/39 341/143 |
| 5,635,937 A * | 6/1997 | Lim | .................... | H03M 1/168 341/118 |
| 5,739,781 A * | 4/1998 | Kagey | ...................... | H03M 1/44 341/155 |
| 6,288,663 B1 * | 9/2001 | Hester | ................. | H03M 1/0695 341/155 |
| 7,187,318 B1 * | 3/2007 | Lee | ........................ | H03M 1/168 341/122 |
| 7,289,053 B2 * | 10/2007 | Bunin | ..................... | H03M 1/06 341/155 |
| 7,999,719 B2 * | 8/2011 | Jeon | ....................... | H03M 1/164 341/161 |
| 8,446,304 B2 * | 5/2013 | Scanlan | ............. | H03M 1/1004 341/120 |
| 10,103,742 B1 * | 10/2018 | Guo | ........................ | H03M 1/68 |
| 2006/0267812 A1 * | 11/2006 | Bunin | ................... | H03M 1/145 341/120 |
| 2010/0156692 A1 * | 6/2010 | Jeon | ...................... | H03M 1/164 341/162 |
| 2012/0229313 A1 * | 9/2012 | Sin | ....................... | H03M 1/1225 341/110 |
| 2017/0338832 A1 * | 11/2017 | Voinigescu | ......... | H03M 1/1245 |

* cited by examiner

*Primary Examiner* — Jean B Jeanglaude
(74) *Attorney, Agent, or Firm* — Patent Law Office, PC; Bao Tran

(57) ABSTRACT

A new SARADC has two low resolution SAR (Successive Approximation Register) ADCs coupled together by an amplifier to increase the overall resolution and enhance ADC conversion rate. The gain reduction of amplifier is corrected by shifting the digital binary output position. Two SAR ADC outputs are timing aligned and summed to produce final high-resolution high conversion rate ADC output.

20 Claims, 8 Drawing Sheets

US 10,938,399 B1

DIGITAL CORRECTED TWO-STEP SAR ADC

BACKGROUND

SAR ADC speed is limited by the serial decision making process. Moreover, high resolution SAR ADC suffers from a large sampling capacitor which requires significant time for voltage settling. A novel digital corrected two-step SARADC is presented to increase ADC resolution and boost the conversion rate. By coupling two low-resolution SAR ADC with an amplifier, two SAR ADC execute binary search process concurrently to enhance the conversion rate. Two low-resolution SAR ADC outputs are aligned and concatenated to produce the final high resolution ADC output.

SUMMARY

Two low-resolution SARADC (SARADC1 and SARADC2) and an amplifier are coupled to enhance the analog to digital conversion rate. Step one is to convert SARADC1 to M-bit output and SARADC1's amplified residue voltage is coupled to the input of SARADC2. Step two is to convert SARADC2 to N-bit output. SARADC1's M-bit output and SARADC's N-bit output are timing aligned and summed by digital combiner and produce (M+N−R) bit final output, where R is amplifier gain dependent reduced bit number.

Advantages of the presented converter may include one or more of the following: higher resolution and faster analog to digital conversion rate, smaller silicon area and less power consumption.

A more complete appreciation of the present invention and its improvements can be obtained by reference to the accompanying drawings, which are briefly summarized below, to the following detailed description of illustrative embodiments of the invention, and to the appended claims.

DETAILED DESCRIPTION

Figure 1:
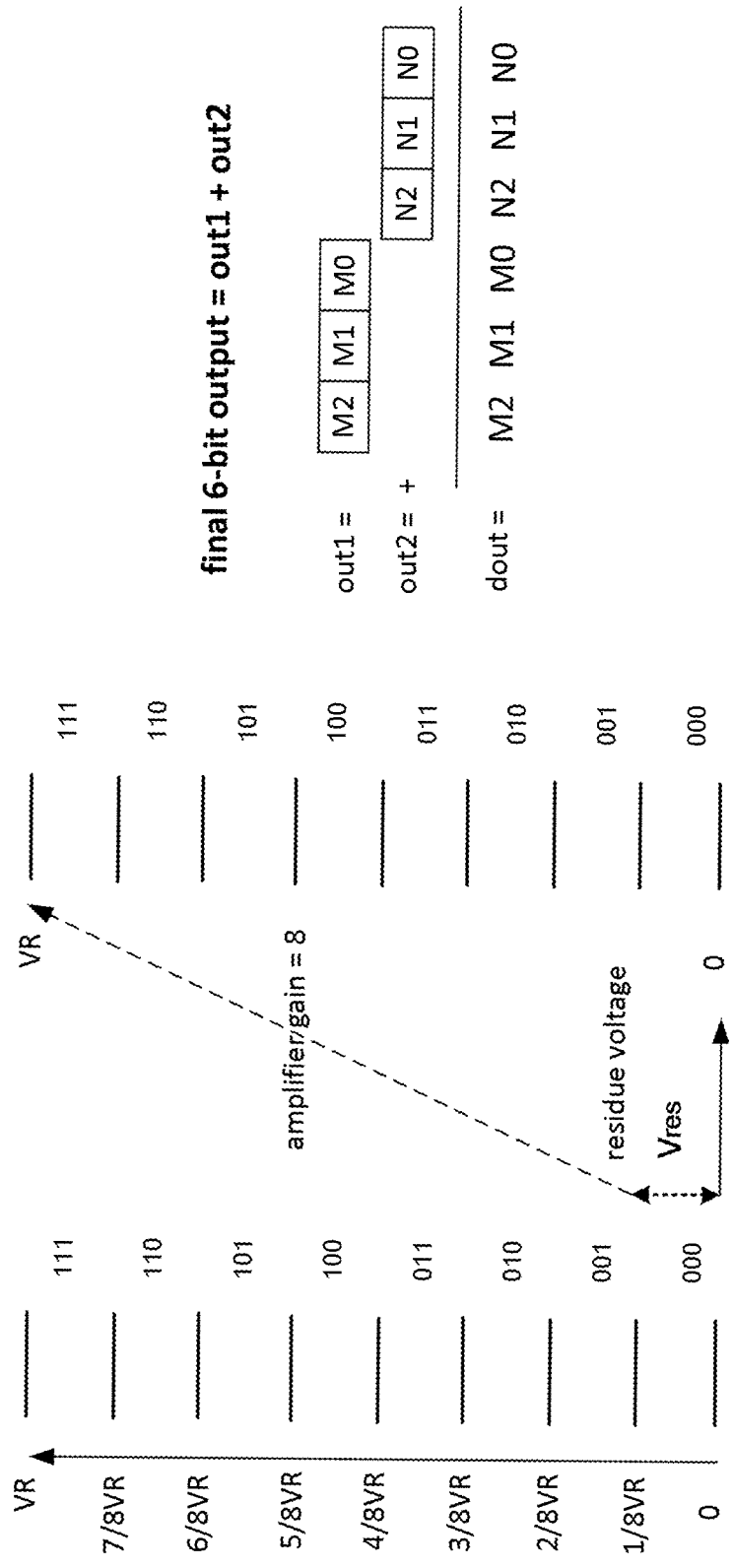
FIG. 1 illustrates voltage range of two-step analog to digital conversion

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes.

The terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Furthermore, it is to be noticed that the term "comprising", used in the claims, should not be interpreted as being restricted to the means listed thereafter; it does not exclude other elements or steps. Thus, the scope of the expression "a device comprising means A and B" should not be limited to devices consisting only of components A and B. It means that with respect to the present invention, the only relevant components of the device are A and B.

Similarly, it is to be noticed that the term "coupled" discloses both direct and indirect coupling and should not be interpreted as being restricted to direct connections only. Thus, the scope of the expression "a device A coupled to a device B" should not be limited to devices or systems wherein an output of device A is directly connected to an input of device B. It means that there exists a path between an output of A and an input of B which may be a path including other devices or means.

Figure 2:
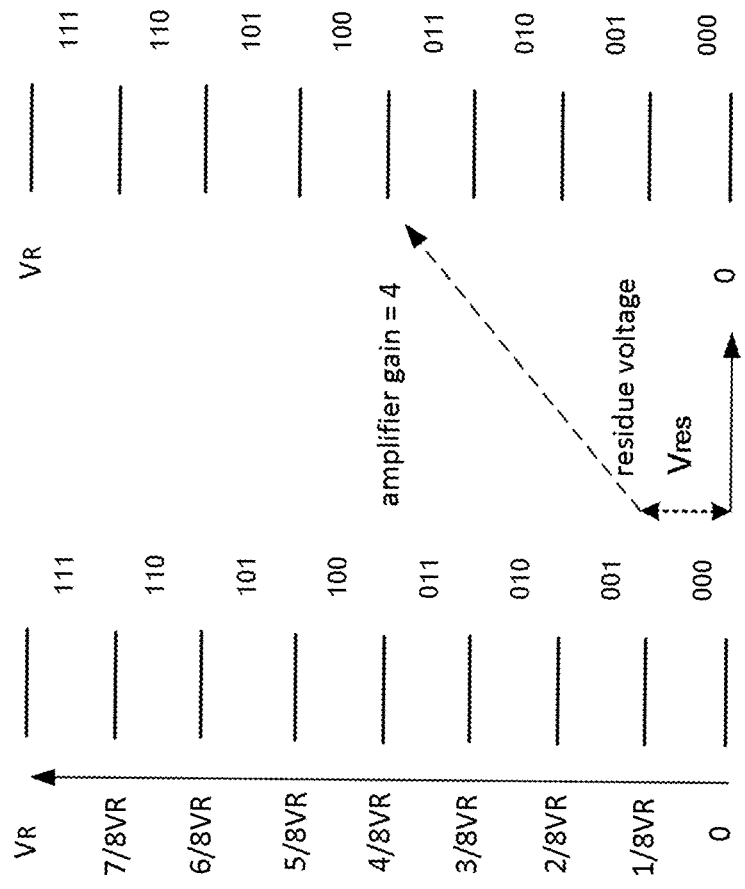
FIG. 2 illustrates voltage range of two-step conversion with half amplifier gain
Figure 3:
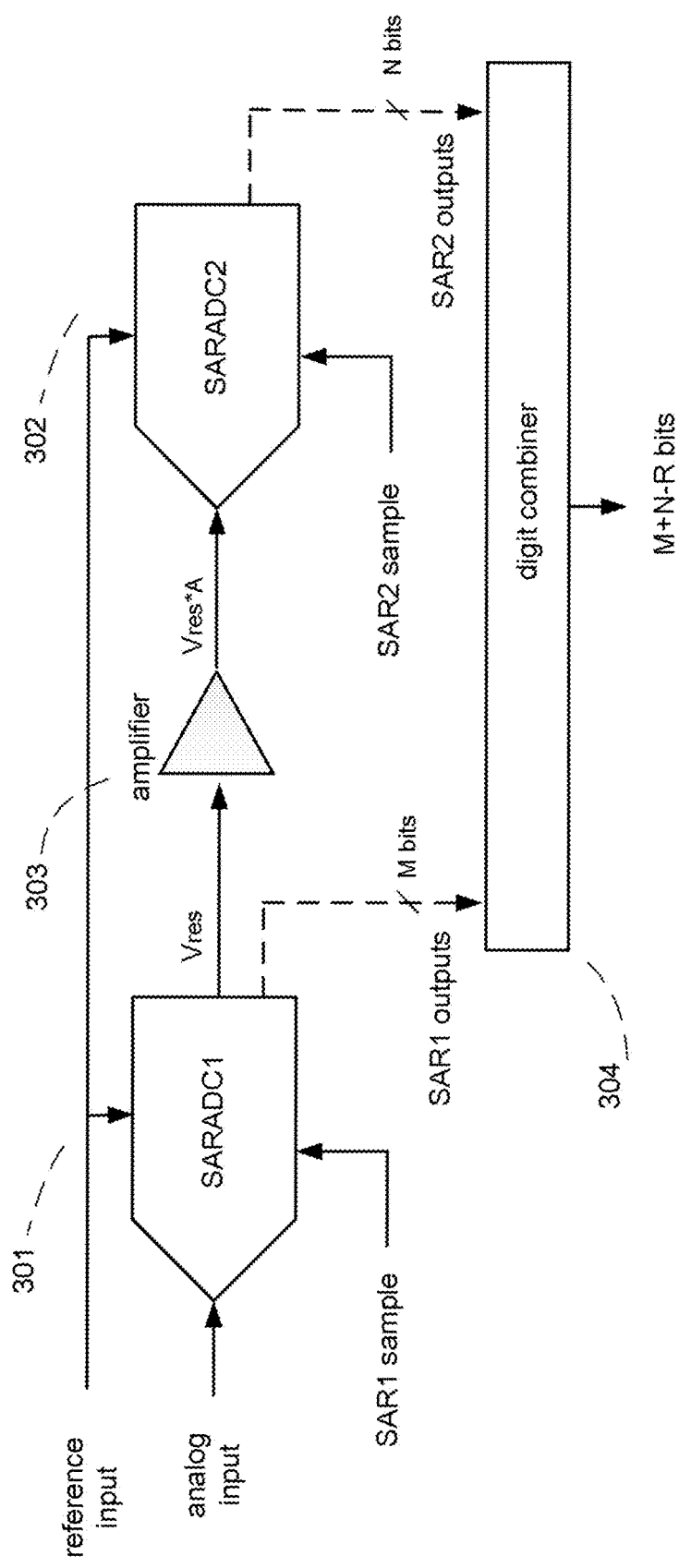
FIG. 3 shows the block diagram of digital corrected two-step SARADC

High resolution SAR (successive approximation register) ADC conversion rate is limited by time required for serial comparison and larger capacitance of the capacitive DAC. To enhance the conversion rate, a novel two-step SAR ADC method is presented. FIG. 1 illustrates the voltage range of the two-step conversion for exemplary 6-bit ADC embodiment. There are two conversion steps and each step converts analog input signal to 3-bit digital outputs. At step 1, input voltage $V_{in}$ is quantized and it produces 3-bit output out1. The residue voltage $V_{res}$ value is from 0 to 1LSB (Least significant bit). One LSB equals reference voltage $V_R$ divided by 8 for 3-bit ADC. The residue voltage Vres is then amplified by eight times. At step 2, amplified $V_{res}$ is quantized and this generates another 3-bit output out2. The final ADC output is concatenating 3-bit out1 and 3-bit out2 to obtain 6-bit outputs. The input/output transfer function of FIG. 1 6-bit ADC is expressed by the following equation:

$$V_{in} = \text{out1} * \text{LSB} + V_{res} \qquad \text{eq}(1)$$

$$8 * V_{res} = \text{out2} * \text{LSB} + q \qquad \text{eq}(2)$$

eq(1) and eq(2) can be combined into equation eq(3)

$$V_{in} = \text{out1} * LSB + \frac{\text{out2} * LSB}{8} + \frac{q}{8} \qquad \text{eq (3)}$$

where $V_{res}$ is the residue of step 1 conversion, q is the quantization error of step 2 conversion To avoid amplified residue voltage saturating step 2 input range, the amplifier gain is practically designated to be four instead of eight. FIG. 2 illustrates the voltage range of the two-step conversion for exemplary 6-bit ADC with half amplifier gain. At step 1, input voltage is quantized to 3-bit output out1. The residue of step 1 conversion is amplified to half of the input range of step 2. At step 2, amplified residue is quantized to 3-bit output out2. Since the amplified residue voltage is half of the input full range $V_R$, step 2 output out2 needs to amplified by two times. This two times amplification is accomplished by shifting out2 to the more significant bit by 1 bit position. The final ADC output is summing 3-bit out1 and shifted 3-bit out2 to obtain 5-bit outputs. The input/output transfer function of FIG. 2 6-bit ADC is expressed by the following equation:

$$V_{in} = out1 * LSB1 + V_{res} \qquad \text{eq(4)}$$

$$4 * V_{res} = out2 * LSB2 + q \qquad \text{eq(5)}$$

eq(4) and eq(5) can be combined into equation eq(6)

$$V_{in} = out1 * LSB1 + \frac{out2 * LSB2}{4} + \frac{q}{4} - \qquad \text{eq (6)}$$

where $V_{res}$ is the residue of step 1 conversion, q is the quantization error of step 2 conversion, LSB1 is the LSB of step 1 conversion, LSB2 is LSB of step 2 conversion FIG. 3 shows the block diagram of the proposed digital corrected two-step SAR analog to digital data converter. SARADC1 (SAR1) 301 output residue is coupled to amplifier 303 with gain of A and amplifier's output A*Vres is coupled to SARADC2 (SAR2) 302. Digital combiner 304 processes and merges SAR1 M-bit output and SAR2 N-bit output then produces final (M+N−R) bit output. R is a reduced-bit number, which is associated with amplifier gain A. SARADC1 and SARADC2 are exactly the same identify and circuitry. The reuse of SARADC1 for SARADC2 minimizes design complexity and reduces the develop time.

Figure 4:
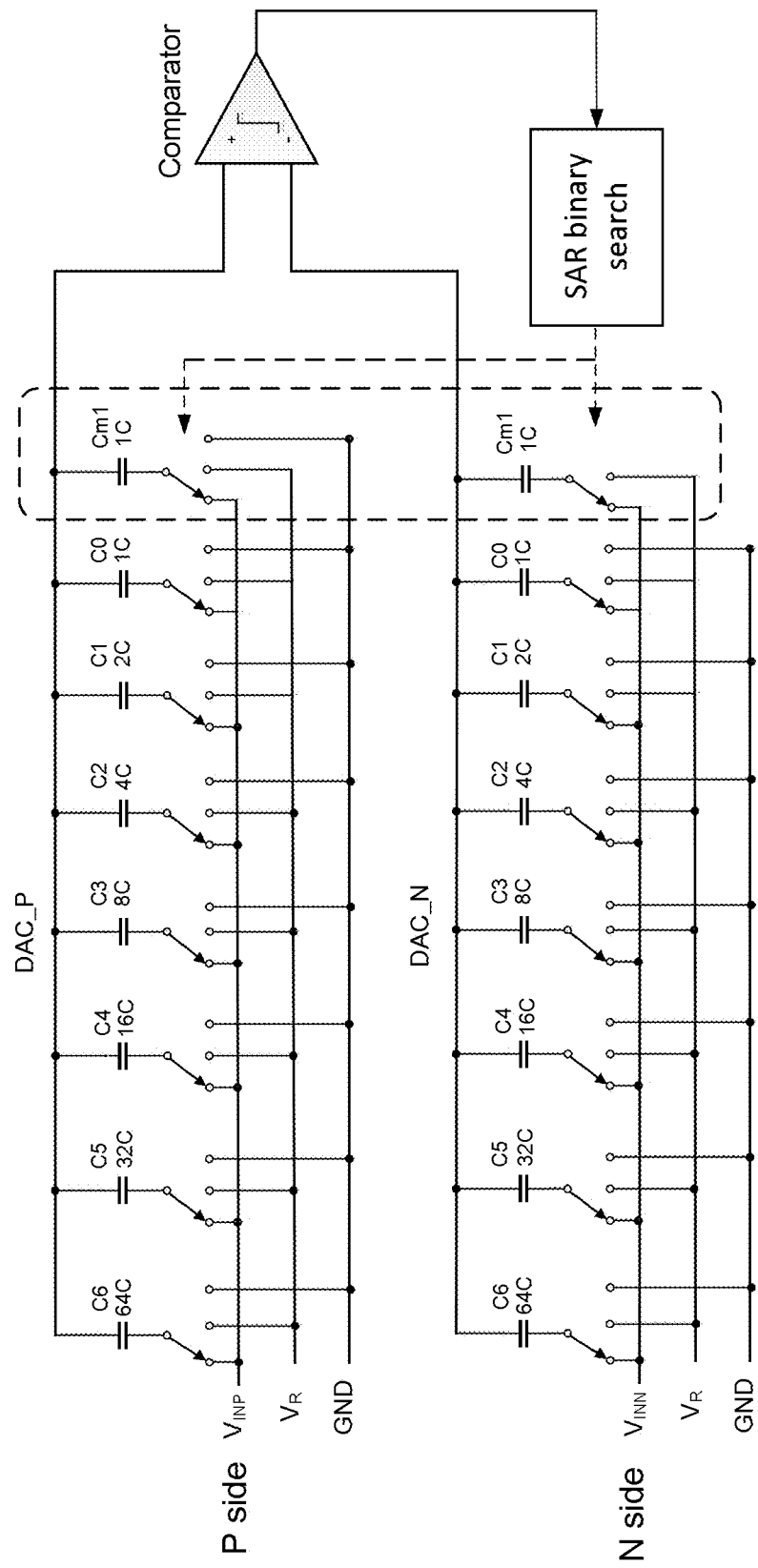
FIG. 4 shows exemplary 7-bit capacitor DAC implementation of two-step SARADC

FIG. 4 shows the exemplary 7-bit capacitive DAC embodiment of SARADC1/SARADC2 in FIG. 3. The presented configuration shows total eight capacitors C[6:0] and Cm1 in each binary capacitor array with capacitor value of 64C/32C/16C/8C/4C/2C/1C/1C respectively. During sampling phase, all the capacitor inputs are coupled to input $V_{INP}/V_{INN}$ and the other sides of capacitors are all connected together to comparator differential inputs DAC_P/DAC_N. During binary search process, the capacitors are asserted to ADC reference $V_R$ or GND from C6 to C1 consecutively controlled by SAR binary search logic.

Unlike quantization error value can be positive or negative from +0.5 LSB to −0.5LSB, the residue voltage is a positive number from 0 to 1LSB as indicated in equation 1 eq(1). The additional capacitor Cm1 with value 1C is inserted to subtract 0.5LSB from residue voltage 0~1LSB. At the end of 7-bit binary search process, P-side Cm1 capacitor is asserted from $V_R$ to GND while N-side Cm1 capacitor stays with $V_R$. Note that N-side Cm1 capacitor doesn't couple to GND and only P-side Cm1 is asserted. The difference between P-side and N-side Cm1 is outlined in dashed box. The insertion of Cm1 capacitor converts residue voltage from 0~1LSB to +/−0.5LSB.

For input range of 0~1LSB, the amplifier output is always positive. Conversely, for +/−0.5LSB input range, the amplifier output can be positive or negative. Therefore, the differential signal range of amplifier output is doubled and hence overall SNR (signal-to-noise ratio) is improved. Inserting Cm1 capacitor doesn't reduce conversion rate of ADC since it does not perform extra bit-test.

Figure 5:
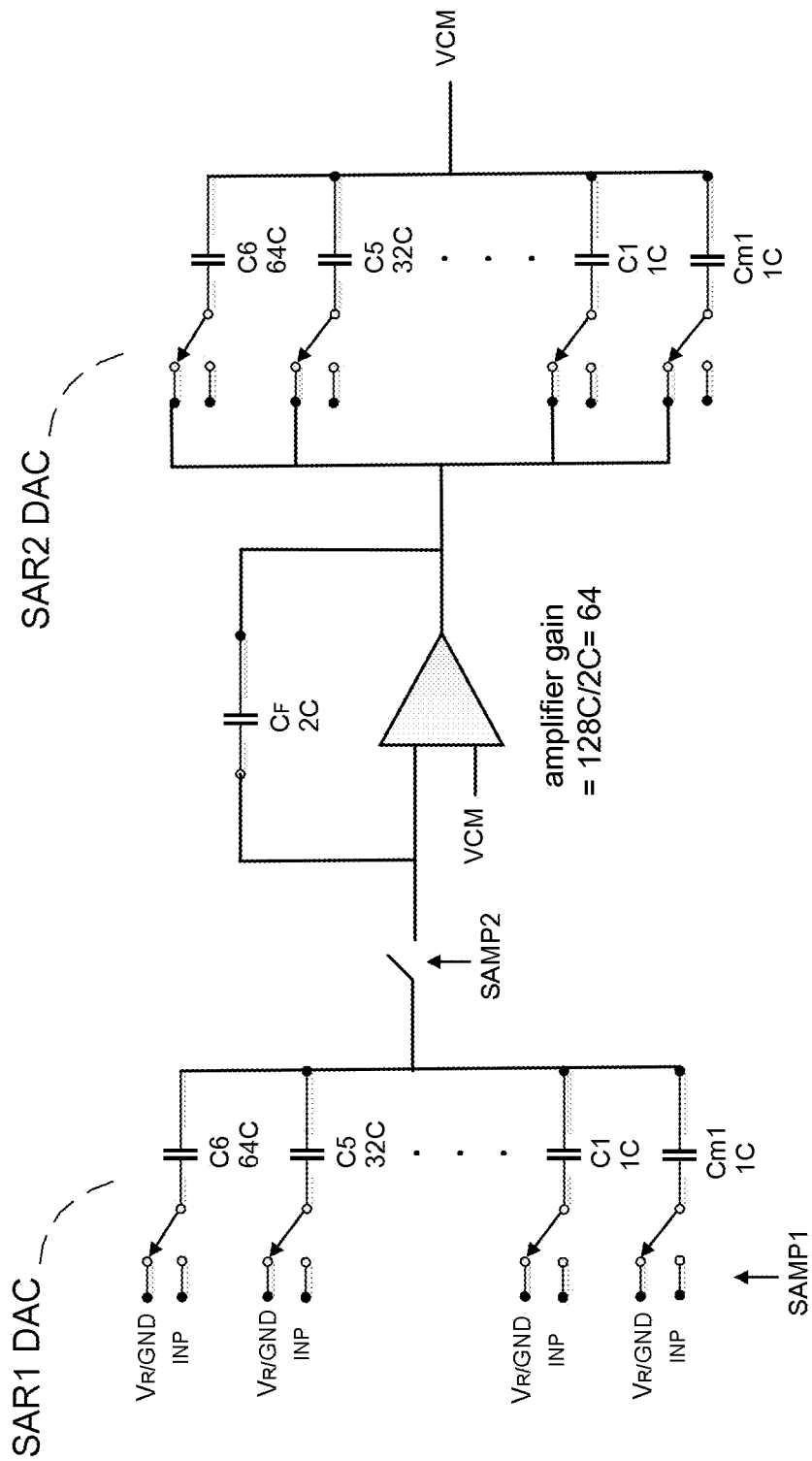
FIG. 5 shows the coupling between the amplifier and two SARADCs
Figure 6:
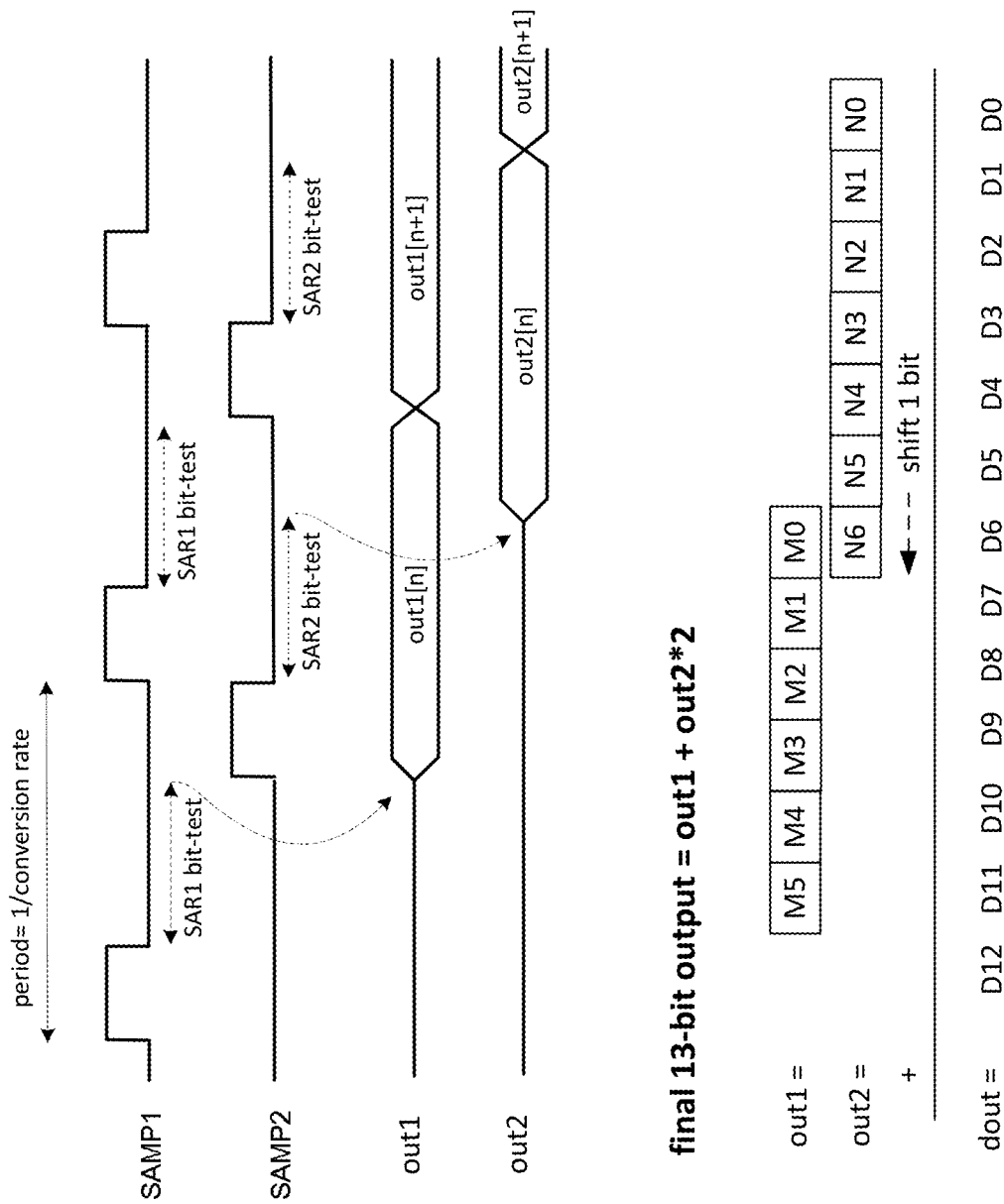
FIG. 6 illustrates the timing diagram and digital output combining operation

FIG. 5 shows the coupling between amplifier and SARADC1/SARADC2. Single end configuration is illustrated and only capacitive DAC of SARADC is shown for simplicity while actual implementation is differential configuration. FIG. 6 illustrates the associated timing diagram of two-step SAR and output combining operation. The feedback capacitor of amplifier is 2C. For total capacitor 128C of SAR1, the amplifier gain is 64. When SAMP1 is asserted, all the capacitor of SAR1 is coupled to input INP. Once input sampling is complete, SAR1 executes bit test of binary search process. At end of the SAR1 bit test, SAR1 capacitor switches either coupled to $V_R$ or GND and SAR1 output out1 is obtained. Then SAMP2 is then asserted such that SAR1 residue voltage is amplified and acquired by SAR2 sampling capacitors. SAMP1 is asserted again immediately after SMAP2 is complete. Concurrently SAR2 continues to perform SAR2 bit test till out2 is produced. Owing to the concurrent operation of SAR1 and SAR2, the overall conversion rate is increased.

Compared with conventional 14-bit SARADC, the next sampling can only occur after 14 bit binary search is complete. But for two 7-bit SARADC in FIG. 5, two SARADC execute binary search bit test simultaneously and hence the conversion rate is enhanced. Besides, conventional 14-bit SARADC utilizes total 2 to the power of 14 equals 16384 capacitors while two 7-bit SARADC only utilizes two times of 2 to the power of 7 equals 256 capacitors. The reduced RC time constant improves the voltage settling and hence boosts the ADC conversion rate.

For amplifier gain of 64 in FIG. 5, the amplifier output range is half of input range of 7-bit SAR2. SAR2 output out2 is corrected by shifting one bit to the left to compensate the gain reduction. SAR1 output out1 and SAR2 output out2 are aligned on the timing then summed to yield the final 13-bit two-step SAR ADC as illustrated on FIG. 6. The half of gain on analog circuit is corrected on the digital multiplication by shifting bits position.

Figure 7:
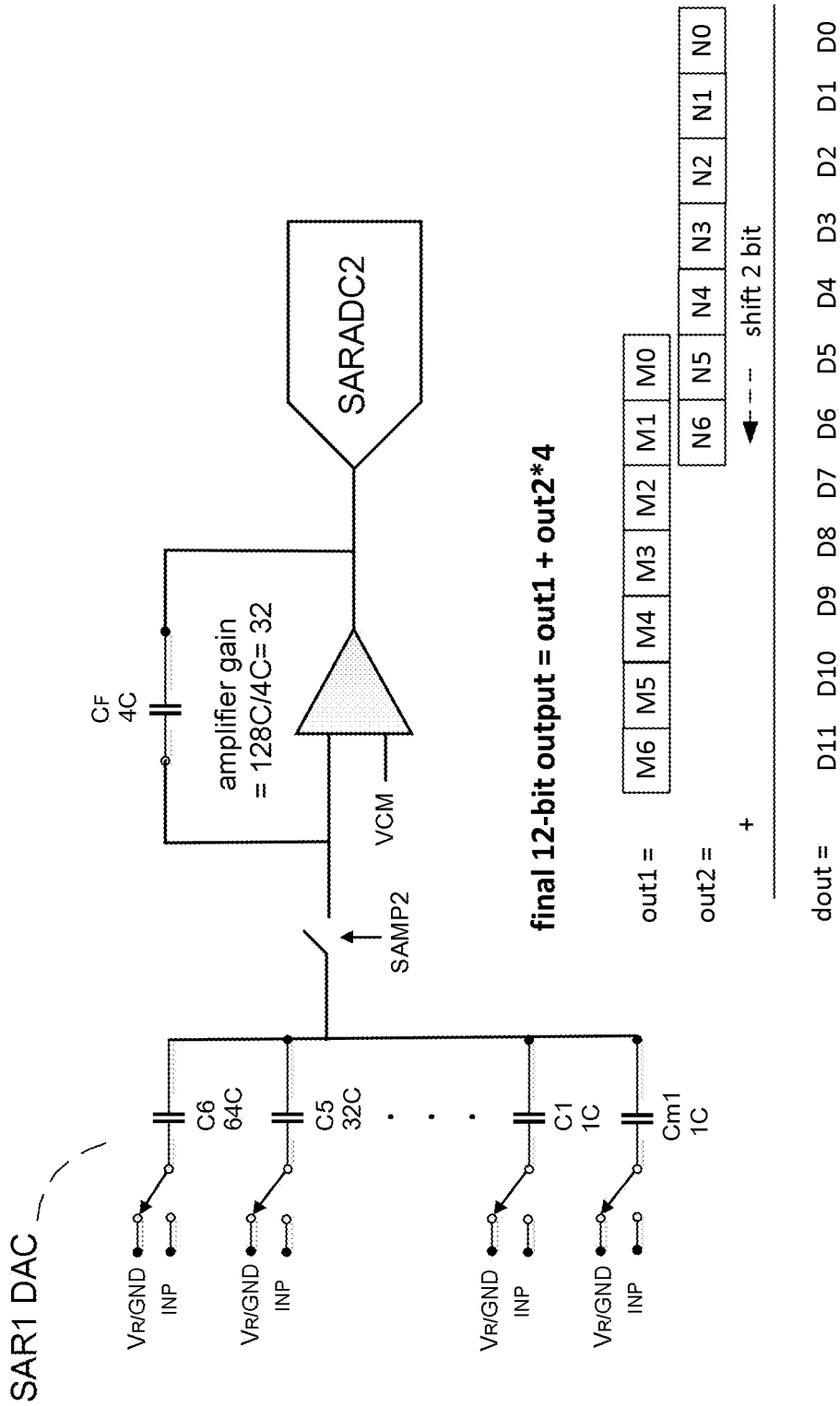
FIG. 7 illustrates another two-step SAR configuration with more amplifier gain reduction

FIG. 7 illustrates another two-step SAR configuration. The feedback capacitor of amplifier is 4C while the total capacitor of SAR1 is 128C. The amplifier gain is further reduced to 32 for 7-bit SARADC. The motivation is to reduce amplifier power consumption since the feedback factor of closed loop amplifier is increased by two times. The amplified residue output range is only a quarter of the full range of SAR2, therefore the output of SAR2 is shifted by 2 bits to correct the reduction. The final output resolution of two-step SAR is (M+N−R)=(7+7−2)=12 bits after aligning and summing SAR1/SAR2 7-bit outputs.

By coupling M-bit SARADC and N-bit SARADC with an amplifier, the overall ADC resolution is increased. Owing to the concurrently binary search of the two SARADCs, and the overall analog to digital conversion rate is enhanced. Moreover, the overall capacitor area is smaller since M+N bit capacitors are separated into two lower resolution capacitors. The gain reduction of amplifier is corrected digitally by shifting the output bits position.

Figure 8:
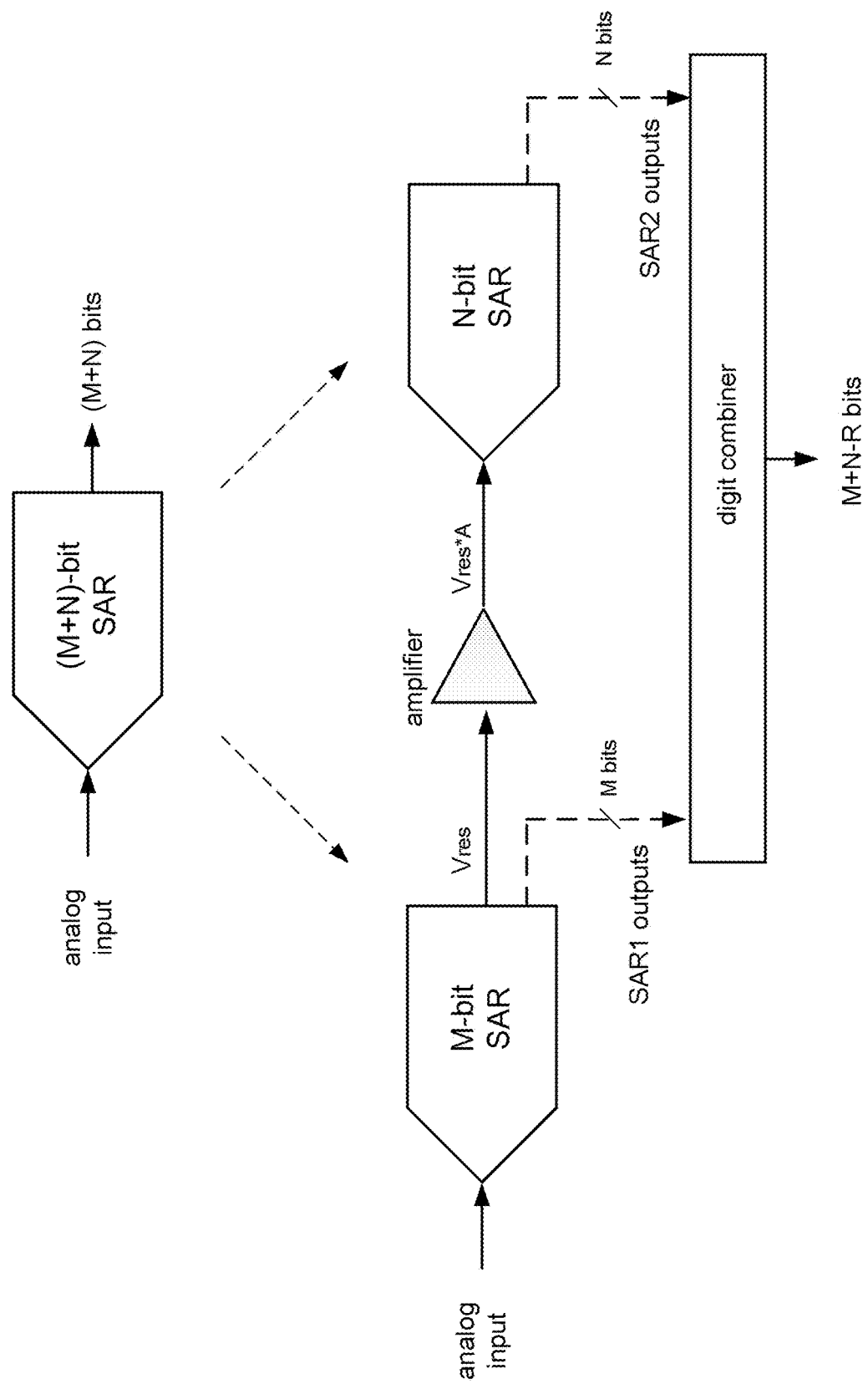
FIG. 8 illustrates (M+N)-bit SAR being split into M-bit SARADC and N-bit SARADC

Predominantly a (M+N) bit SARADC can be split into M-bit SARADC and N-bit SARADC coupled by an amplifier and a digit combiner as illustrated on FIG. 8. The benefits include lower total capacitor value, lower power consumption, higher resolution, faster conversion rate and smaller silicon area.

The subject matter described above is provided by way of illustration only and should not be construed as limiting. Furthermore, the claimed subject matter is not limited to implementations that solve any or all disadvantages noted in any part of this disclosure. Various modifications and changes may be made to the subject matter described herein without following the example embodiments and applications illustrated and described, and without departing from the true spirit and scope of the present invention, which is set forth in the following claims.

What is claimed is:

1. A digital corrected two-step Successive Approximation Register ADC (SARADC), comprising:
   a M-bit SARADC1; and
   an amplifier; and
   a N-bit SARADC2; and a digit combiner wherein the residue voltage of SARADC1 is amplified and coupled to SARADC2, wherein SARADC1 and SARADC2 outputs are aligned and summed by the digit combiner to produce a final (M+N−R) bit ADC output, and R is amplifier gain dependent reduced bit number operating the SARADC with an input/output transfer function as:

$$V_{in} = out1 * LSB1 + \frac{out2 * LSB2}{4} + \frac{q}{4}$$

where Vres is a residue of a first conversion, q is a quantization error of a second conversion, LSB1 is the least significant bit (LSB) of the first conversion, and LSB2 is LSB of the second conversion.

2. The SARADC of claim 1, comprising a capacitor inserted into M-bit capacitive DAC and asserted after binary search bit-test to subtract 0.5LSB voltage from residue voltage range of 0~1LSB.

3. The SARADC of claim 1, wherein the residue voltage range is shifted from 0~1LSB to −0.5LSB to +0.5LSB to double amplifier output range and increase ADC SNR (Signal-to-Noise Ratio).

4. The SARADC of claim 1, wherein the amplifier gain is reduced by half to avoid saturating the input range of SARADC2; SARADC2 output is digitally corrected by shifting 1 bit position to compensate the gain reduction.

5. The SARADC of claim 1, wherein the amplifier gain is reduced by four times to reduce amplifier power consumption; SARADC2 output is digitally corrected by shifting 2 bits position to compensate a gain reduction.

6. The SARADC of claim 1, wherein two low-resolution SARADCs are coupled by an amplifier, two low-resolution SARADC outputs are concatenated to yield a final ADC output.

7. The SARADC of claim 1, wherein two low-resolution SARADC binary search process are executed concurrently to enhance a final ADC conversion rate.

8. The SARADC of claim 1, wherein the SARADC1 and SARADC2 comprises the same circuitry and employ the same reference voltage to minimize design complexity and reduce the development time.

9. The SARADC of claim 1, wherein (M+N) bit SARADC is split into M-bit SARADC and N-bit SARADC coupled by an amplifier to reduce total capacitor value from $2^{(M+N)}C$ to sum of $2^{M}C$ and $2^{N}C$.

10. The SARADC of claim 1, wherein the (M+N) bit SARADC is split into M-bit SARADC and N-bit SARADC coupled by an amplifier to reduce capacitor value, power consumption and area.

11. A method of enhancing Analog-to-Digital conversion rate, comprising: coupling two low resolution SARADCs with an amplifier; and executing two SARADCs concurrently to boost the final ADC conversion rate and operating the SARADC with an input/output transfer function as:

$$V_{in} = out1 * LSB1 + \frac{out2 * LSB2}{4} + \frac{q}{4}$$

where Vres is a residue of a first conversion, q is a quantization error of a second conversion, LSB1 is the least significant bit (LSB) of the first conversion, and LSB2 is LSB of the second conversion.

12. A method of increasing Analog-to-Digital resolution, comprising: coupling two low resolution SARADCs with an amplifier; and concatenating two low resolution SARADC outputs to yield a final ADC output, and operating the SARADC with an input/output transfer function as:

$$V_{in} = out1 * LSB1 + \frac{out2 * LSB2}{4} + \frac{q}{4}$$

where Vres is a residue of a first conversion, q is a quantization error of a second conversion, LSB1 is the least significant bit (LSB) of the first conversion, and LSB2 is LSB of the second conversion.

13. The method of claim 12, comprising inserting a capacitor in (original) The SARADC capacitive DAC and activated after binary search process to shift the residue voltage from 0~1LSB to +/−0.5LSB.

14. The method of claim 12, wherein SARADC residue voltage is shifted from 0~1LSB to +/−0.5LSB to double amplifier output range and enhance ADC SNR (Signal-to-Noise Ratio).

15. The method of claim 12, comprising reducing the amplifier gain by half to avoid saturating the input range of second SARADC; and shifting SARADC digital outputs by 1-bit position to compensate the gain reduction and operating the SARADC with an input/output transfer function as:

$$V_{in} = out1 * LSB1 + \frac{out2 * LSB2}{4} + \frac{q}{4}$$

where Vres is a residue of a first conversion, q is a quantization error of a second conversion, LSB1 is the least significant bit (LSB) of the first conversion, and LSB2 is LSB of the second conversion.

16. The method of claim 12, comprising reducing the amplifier gain by 4 times to reduce amplifier power consumption; and shifting SARADC digital outputs by 2-bit position to compensate the gain reduction.

17. The method of claim 12, comprising reducing the amplifier gain and digitally correcting the gain reduction by shifting digital output bit position to maintain overall SNR (Signal-to-Noise Ratio).

18. The method of claim 12, comprising utilizing (original) The SARADC circuitry and reference voltage to minimize design complexity and reduce development time.

19. The method of claim 12, wherein a high resolution SARADC is separated into two low resolution SARADCs coupled by an amplifier to reduce the total capacitor value.

20. The method of claim 12, wherein a high resolution SARADC is split into two low resolution SARADCs coupled by an amplifier to reduce the power consumption and silicon area.

* * * * *